(12) United States Patent
Kang et al.

(10) Patent No.: US 11,049,695 B2
(45) Date of Patent: Jun. 29, 2021

(54) METAL CONTACT LANDING STRUCTURE

(71) Applicant: Micromaterials LLC, Wilmington, DE (US)

(72) Inventors: Sung Kwan Kang, San Jose, CA (US); Kyung-Ha Kim, Cupertino, CA (US); Gill Lee, San Jose, CA (US)

(73) Assignee: Micromaterials LLC, Wilmington, DE (US)

( * ) Notice: Subject to any disclaimer, the term of this patent is extended or adjusted under 35 U.S.C. 154(b) by 0 days.

(21) Appl. No.: 16/777,538

(22) Filed: Jan. 30, 2020

(65) Prior Publication Data

US 2020/0168440 A1 May 28, 2020

Related U.S. Application Data

(63) Continuation of application No. PCT/US2018/043496, filed on Jul. 24, 2018.
(Continued)

(51) Int. Cl.
*H01J 37/32* (2006.01)
*H01L 21/02* (2006.01)
*H01L 21/3065* (2006.01)

(52) U.S. Cl.
CPC .... *H01J 37/32357* (2013.01); *H01J 37/3244* (2013.01); *H01J 37/32422* (2013.01);
(Continued)

(58) Field of Classification Search
USPC .......................................................... 438/710
See application file for complete search history.

(56) References Cited

U.S. PATENT DOCUMENTS

2014/0080308 A1* 3/2014 Chen ................. H01J 37/32357
438/723
2014/0363922 A1 12/2014 Chen
(Continued)

FOREIGN PATENT DOCUMENTS

JP 2016-537824 A 12/2016
JP 2018-041793 A 3/2018
(Continued)

OTHER PUBLICATIONS

International Search Report and Written Opinion dated Nov. 8, 2018 in International Patent Application No. PCT/US2018/043496, 13 pages.
(Continued)

*Primary Examiner* — Roberts P Culbert
(74) *Attorney, Agent, or Firm* — Kilpatrick Townsend & Stockton LLP

(57) ABSTRACT

Processing methods may be performed to form semiconductor structures that may include three-dimensional memory structures. The methods may include forming a plasma of a fluorine-containing precursor in a remote plasma region of a processing chamber. The methods may include contacting a semiconductor substrate with effluents of the plasma. The semiconductor substrate may be housed in a processing region of the processing chamber. The methods may include selectively cleaning exposed nitride materials with the effluents of the plasma. The methods may also include subsequently depositing a cap material over the cleaned nitride material. The cap material may be selectively deposited on the nitride material relative to exposed regions of a dielectric material.

18 Claims, 7 Drawing Sheets

Related U.S. Application Data

(60) Provisional application No. 62/541,384, filed on Aug. 4, 2017.

(52) U.S. Cl.
CPC .... *H01L 21/0217* (2013.01); *H01L 21/02164* (2013.01); *H01L 21/3065* (2013.01)

(56) References Cited

U.S. PATENT DOCUMENTS

| | | |
|---|---|---|
| 2015/0255385 A1 | 9/2015 | Lee et al. |
| 2015/0287710 A1 | 10/2015 | Yun et al. |

FOREIGN PATENT DOCUMENTS

| | | |
|---|---|---|
| KR | 2016-0083049 A | 7/2016 |
| WO | 2015-038252 A1 | 3/2015 |
| WO | 2020-016915 A1 | 1/2020 |

OTHER PUBLICATIONS

International Preliminary Report on Patentability dated Feb. 4, 2020 in International Patent Application No. PCT/US2018/043496, 9 pages.

* cited by examiner

METAL CONTACT LANDING STRUCTURE

RELATED APPLICATIONS

This application is a continuation of International Patent Application No. PCT/US2018/043496, filed on Jul. 24, 2018, which claims priority to U.S. Provisional Application No. 62/541,384, filed Aug. 4, 2017, both of which are hereby incorporated by reference in their entirety for all purposes.

TECHNICAL FIELD

The present technology relates to semiconductor systems, processes, and equipment. More specifically, the present technology relates to systems and methods for selectively etching and selectively depositing material layers on a semiconductor device.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials. Deposition processes, however, continue to be performed across substrates generally utilizing a blanket coat or a conformal fill.

As device sizes continue to shrink in next-generation devices, selectivity may play a larger role when only a few nanometers of material are formed in a particular layer, especially when the material is critical in the transistor formation. Many different etch process selectivities have been developed between various materials, although standard selectivities may no longer be suitable at current and future device scale. Additionally, queue times for processes continue to rise based on the number of masking, formation, and removal operations needed to form and protect the various critical dimensions of features across a device while patterning and formation are performed elsewhere on a substrate.

Thus, there is a need for improved systems and methods that can be used to produce high quality devices and structures. These and other needs are addressed by the present technology.

SUMMARY

Processing methods may be performed to form semiconductor structures that may include three-dimensional memory structures. The methods may include forming a plasma of a fluorine-containing precursor in a remote plasma region of a processing chamber. The methods may include contacting a semiconductor substrate with effluents of the plasma. The semiconductor substrate may be housed in a processing region of the processing chamber. The methods may include selectively cleaning exposed nitride materials with the effluents of the plasma. The methods may also include subsequently depositing a cap material over the cleaned nitride material. The cap material may be selectively deposited on the nitride material relative to exposed regions of a dielectric material.

In some embodiments, the etching may be performed in a first processing chamber, and the depositing may be performed in a second processing chamber. The methods may also include transferring the semiconductor substrate from the first processing chamber to the second processing chamber, and the transferring may be performed without breaking vacuum. The methods may also include selectively etching the nitride materials and the cap material to form a gap. The etching may be or include a wet etch or a plasma-enhanced etch. The methods may also include forming a metal material within the gap. The metal material may be or include titanium nitride or tungsten, or both in some embodiments. The cap material may include silicon nitride. The dielectric material may be or include silicon oxide. The deposition may be performed with a selectivity towards the nitride materials relative to the dielectric material greater than or about 2:1. Selectively depositing the cap material may include inhibiting growth of the cap material on the dielectric material. The substrate may include alternating layers of nitride materials and dielectric materials, and the cap material may be formed to maintain separation between separate cap material formations.

The present technology also encompasses methods of forming a semiconductor structure. The methods may include forming a plasma of a fluorine-containing precursor in a remote plasma region of a processing chamber. The methods may include contacting a semiconductor substrate with effluents of the plasma. The semiconductor substrate may be housed in a processing region of the processing chamber. The methods may include selectively cleaning exposed regions of a nitride material positioned proximate exposed regions of a dielectric material on the semiconductor substrate. The methods may also include subsequently forming a cap material over the nitride material. The cap material may be selectively formed on the nitride material relative to exposed regions of the dielectric material.

In some embodiments, the substrate may include a first exposed region of the nitride material and a second exposed region of the nitride material vertically separated by an exposed region of the dielectric material. The dielectric material may be or include silicon oxide. The cap material may be or include silicon nitride. Each exposed region of the nitride material may include an exposed top surface and an exposed sidewall normal to the top surface. The cap material may be formed on the exposed top surface and the exposed sidewall of the first nitride material and the second nitride material. The cap material may be formed on the first nitride material and may not contact the cap material formed on the second nitride material subsequent the formation. The methods may also include removing the first nitride material, the second nitride material, and the cap materials from the semiconductor substrate.

Such technology may provide numerous benefits over conventional systems and techniques. For example, the processes may provide more area for metal contact landing. Additionally, by performing selective operations, fewer masking and removal operations may be performed, which may reduce fabrication queue times dramatically, and allow otherwise difficult structures to be formed. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
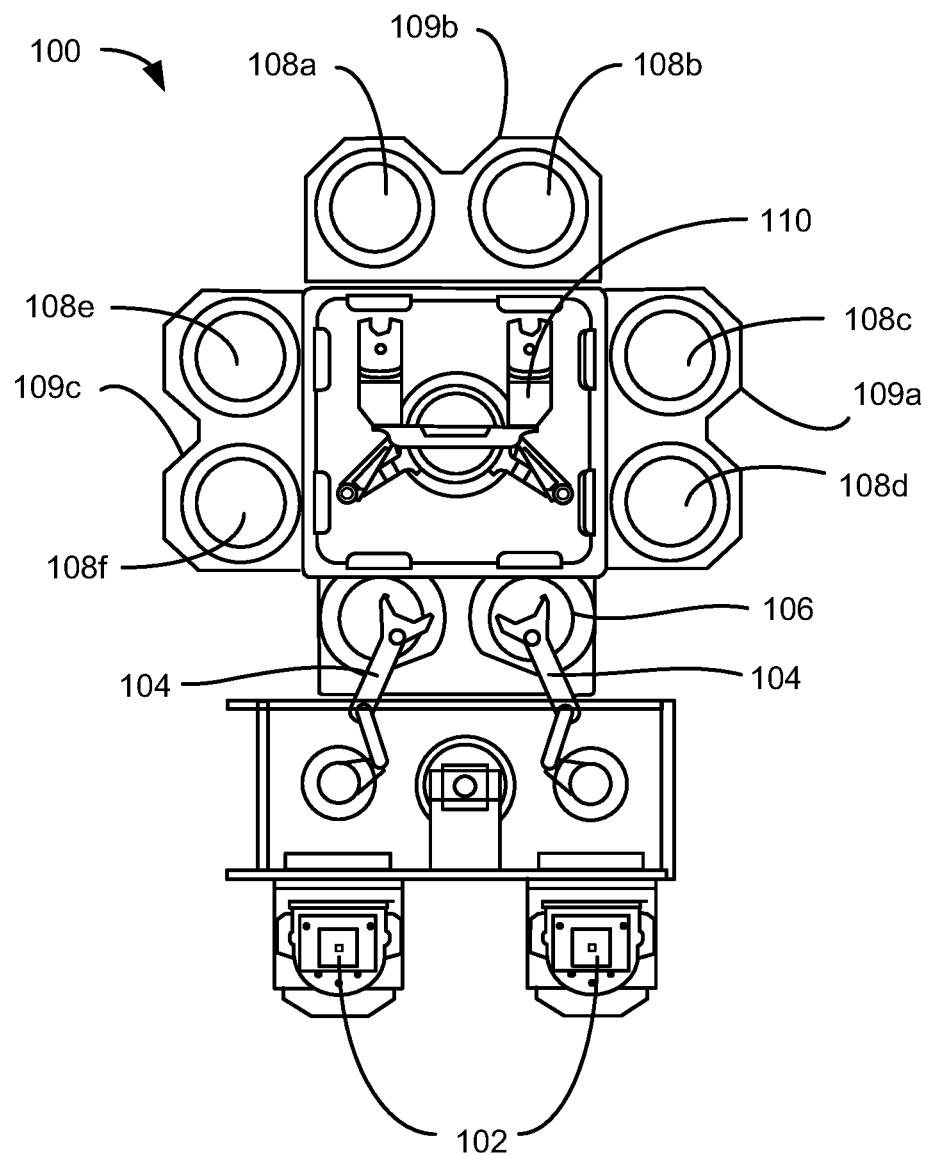
FIG. 1 shows a top plan view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of small pitch features. In transitioning from 2D NAND to 3D NAND, many process operations are modified from vertical to horizontal operations, so as to laterally etch and form material layers. Additionally, as 3D NAND structures grow in the number of cells being formed, the aspect ratios of memory holes and other structures increase, sometimes dramatically. In conventional 3D NAND processing, stacks of placeholder layers and dielectric materials may form the inter-electrode dielectric or IPD layers. These placeholder layers may have a variety of operations performed to create structures before fully removing the placeholder material and replacing it with metal.

Part of the fabrication process may include forming a staircase structure for providing access for metal contact formation at each vertical level. In certain fabrication operations having oxide-nitride layers, or ONON, the nitride layers are removed to provide access for metallization, which may include metal contact landings. The process of forming this structure may include a number of operations in conventional processing that include, subsequent the staircase formation, forming nitride and oxide layers overlying the staircase. Because these layer formations will be blanket or conformal coatings, a subsequent etch process is performed to laterally etch the sidewalls of the stairs to separate each level. By forming the overlying oxide layer, a top portion of the nitride on each level is protected during the etch. However, this etch process will often over etch the nitride layer of each level laterally, which reduces the exposed portion where the contact landings are formed. The subsequently formed metallization and contact pillars may then be characterized by reduced contact, increased resistance, or other issues.

The present technology overcomes these issues by forming a structure obviating many of these fabrication operations. Where conventional cells form a conformal layer of silicon nitride, the present technology may produce separated regions of additional silicon nitride capping material. This cap may increase the effective area for contact landing material, and may reduce or remove any lateral etching operations, which may more effectively utilize the exposed portion of each level of the memory structure. The present technologies allow these structures to be formed by utilizing a selectively deposited cap layer on the exposed nitride portion of each level of the staircase structure. By selectively depositing the cap material, separation can be produced between each level of the structure without requiring an etch back process of the layers, which may reduce the overall contact landing area.

Although the remaining disclosure will routinely identify specific etching and deposition processes utilizing the disclosed technology, it will be readily understood that the systems and methods are equally applicable to a variety of other etching, deposition, and cleaning processes as may occur in the described chambers. Accordingly, the technology should not be considered to be so limited as for use with the described etching and deposition processes alone. The disclosure will discuss one possible system and chambers that can be used with the present technology to perform certain of the removal and deposition operations before describing operations of an exemplary process sequence according to the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes and selective deposition described herein in addition to cyclical layer deposition (CLD), atomic layer deposition (ALD), chemical vapor deposition (CVD), physical vapor deposition (PVD), wet etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material or metal-containing material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments.

In some embodiments the chambers specifically include at least one etching chamber as described below as well as at least one deposition chamber as described below. By including these chambers in combination on the processing side of the factory interface, all etching and deposition processes discussed below may be performed in a controlled environment. For example, a vacuum environment may be maintained on the processing side of holding area 106, so that all chambers and transfers are maintained under vacuum in embodiments. This may also limit water vapor and other air components from contacting the substrates being processed. It will be appreciated that additional configurations of deposition, etching, annealing, and curing chambers for dielectric films are contemplated by system 100.

Figure 2A:
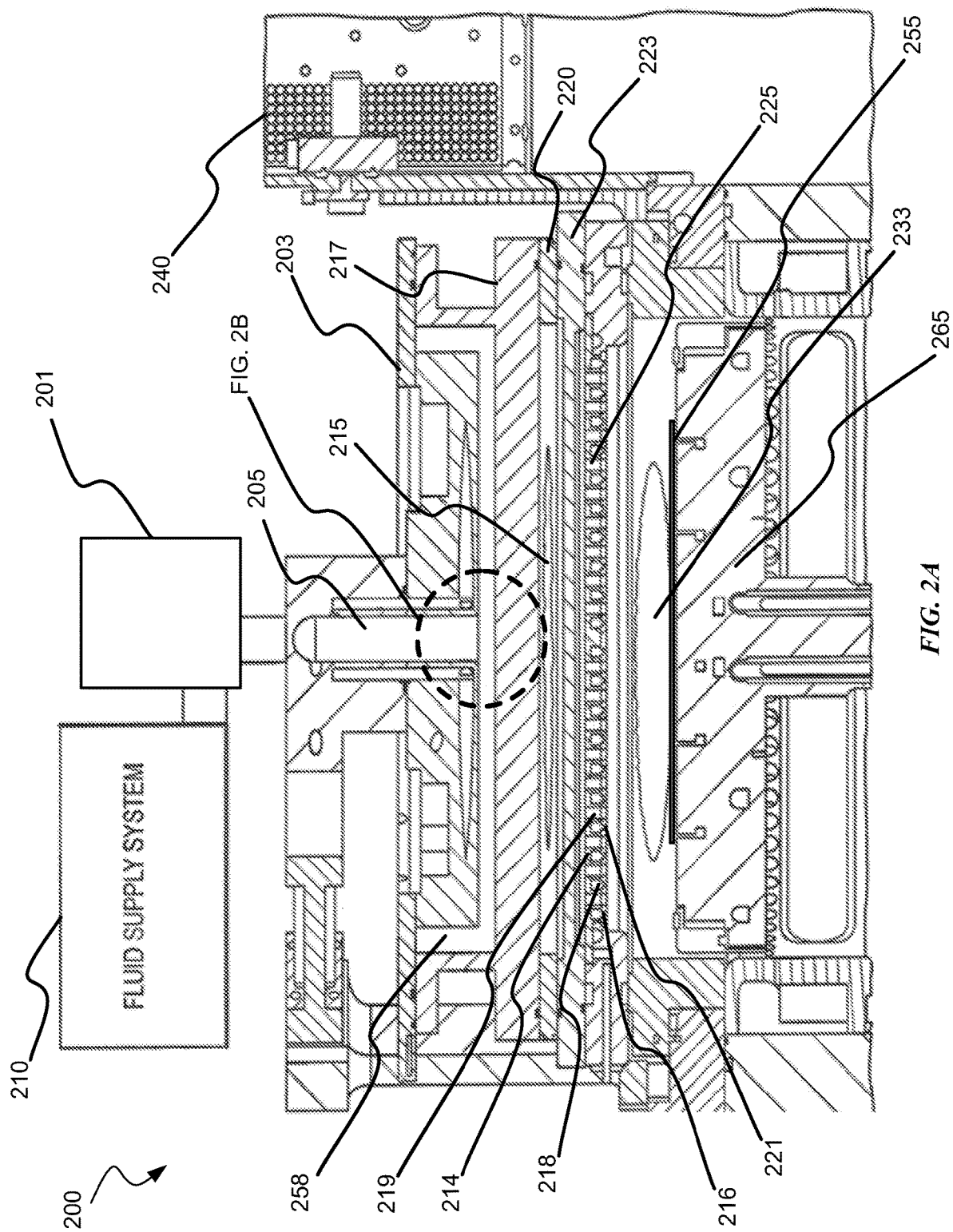
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, cobalt, aluminum oxide, tungsten oxide, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a substrate support 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
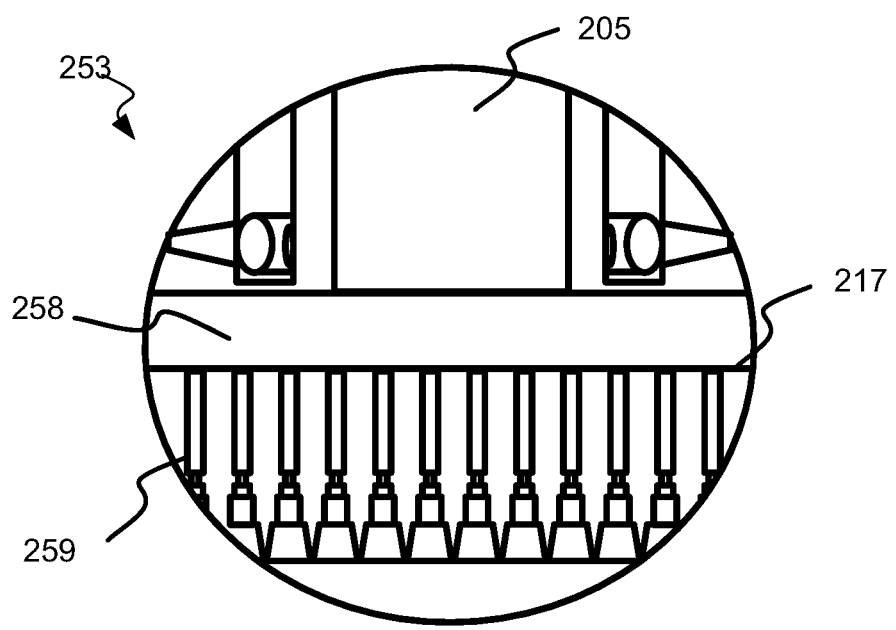
FIG. 2B shows a detailed view of an exemplary showerhead according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
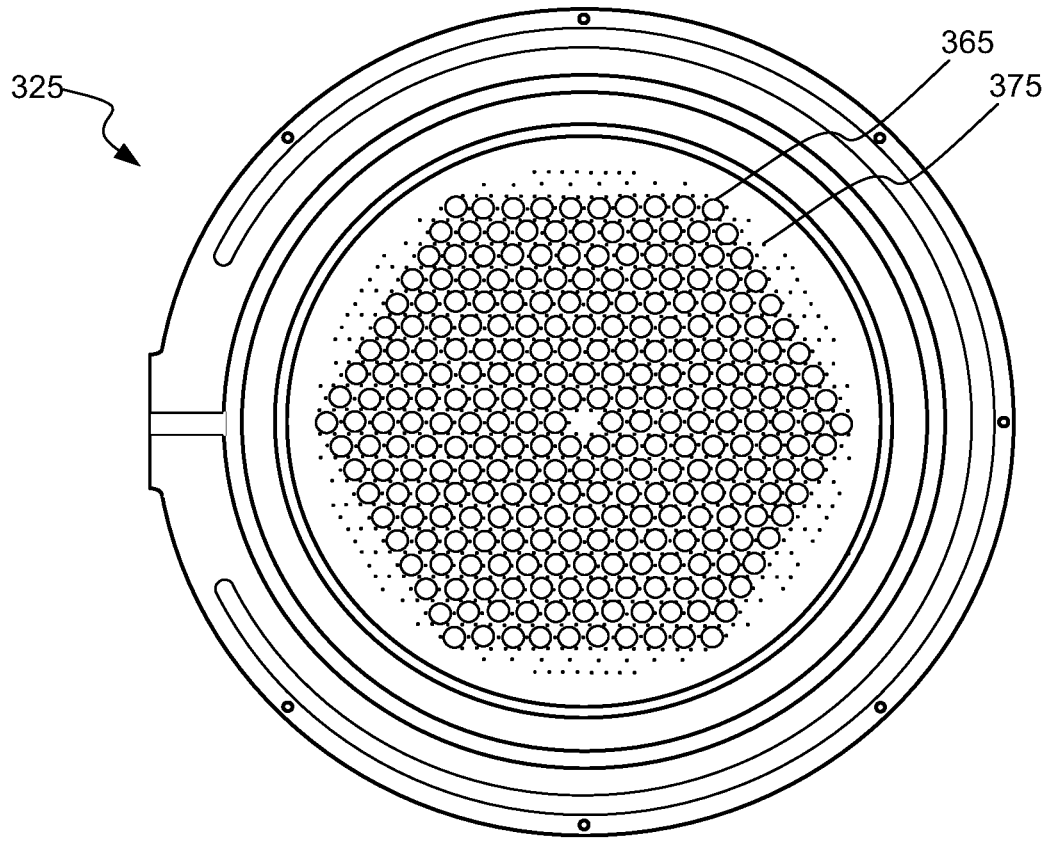
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the gas distribution assembly 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
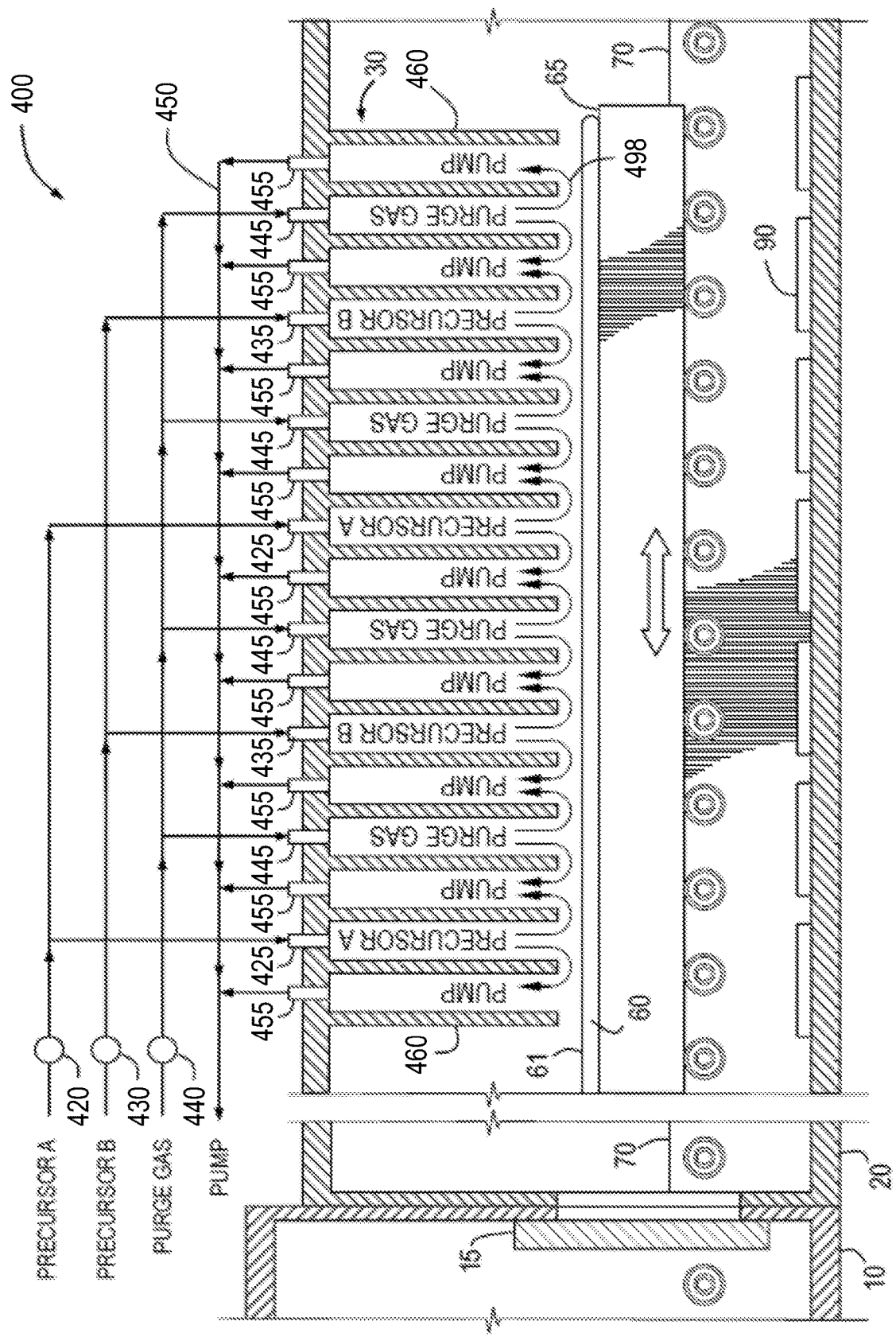
FIG. 4 shows a schematic cross-sectional view of an exemplary processing chamber according to embodiments of the present technology.

Turning to FIG. 4 is shown a schematic cross-sectional view of an atomic layer deposition system 400 or reactor in accordance with one or more embodiments of the present technology. The system 400 may include a load lock chamber 10 and a processing chamber 20. The processing chamber 20 may be generally a sealable enclosure, which may be operated under vacuum, or at least low pressure. The processing chamber 20 may be isolated from the load lock chamber 10 by an isolation valve 15. The isolation valve 15 may seal the processing chamber 20 from the load lock chamber 10 in a closed position and may allow a substrate 60 to be transferred from the load lock chamber 10 through the valve to the processing chamber 20 and vice versa in an open position.

The system 400 may include a gas distribution plate 30 capable of distributing one or more gases across a substrate 60. The gas distribution plate 30 may be any suitable distribution plate known to those skilled in the art, and specific gas distribution plates described should not be taken as limiting the scope of the technology. The output face of the gas distribution plate 30 may face the first surface 61 of the substrate 60.

The gas distribution plate 30 may include a plurality of gas ports configured to transmit one or more gas streams to the substrate 60 and a plurality of vacuum ports disposed between each gas port and configured to transmit the gas streams out of the processing chamber 20. As illustrated in FIG. 4, the gas distribution plate 30 may include a first precursor injector 420, a second precursor injector 430 and a purge gas injector 440. The injectors 420, 430, 440 may be controlled by a system computer (not shown), such as a mainframe, or by a chamber-specific controller, such as a programmable logic controller. The precursor injector 420 may be configured to inject a continuous or pulse stream of a reactive precursor of compound A into the processing chamber 20 through a plurality of gas ports 425. The precursor injector 430 may be configured to inject a continuous or pulse stream of a reactive precursor of compound B into the processing chamber 20 through a plurality of gas ports 435. The purge gas injector 440 may be configured to inject a continuous or pulse stream of a non-reactive or purge gas into the processing chamber 20 through a plurality of gas ports 445. The purge gas may be configured to remove reactive material and reactive by-products from the processing chamber 20. The purge gas may typically be an inert gas, such as nitrogen, argon or helium. Gas ports 445 may be disposed in between gas ports 425 and gas ports 435 so as to separate the precursor of compound A from the precursor of compound B, thereby avoiding cross-contamination between the precursors.

In another aspect, a remote plasma source (not shown) may be connected to the precursor injector 420 and the precursor injector 430 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency, and microwave based discharge techniques may be used. If an RF power source is used, it can be either capacitively or inductively coupled. The activation may also be generated by a thermally based technique, a gas breakdown technique, a high intensity light source, such as ultraviolet light, or exposure to an x-ray source.

The system 400 may further include a pumping system 450 connected to the processing chamber 20. The pumping system 450 may be generally configured to evacuate the gas streams out of the processing chamber 20 through one or more vacuum ports 455. The vacuum ports 455 may be disposed between each gas port so as to evacuate the gas streams out of the processing chamber 20 after the gas streams react with the substrate surface and to further limit cross-contamination between the precursors.

The system 400 may include a plurality of partitions 460 disposed on the processing chamber 20 between each port. A lower portion of each partition may extend close to the first surface 61 of substrate 60, such as, for example, about 0.5 mm or greater from the first surface 61. In this manner, the lower portions of the partitions 460 may be separated from the substrate surface by a distance sufficient to allow the gas streams to flow around the lower portions toward the vacuum ports 455 after the gas streams react with the substrate surface. Arrows 498 indicate the direction of the gas streams. Since the partitions 460 may operate as a physical barrier to the gas streams, they may also limit cross contamination between the precursors. The arrangement shown is merely illustrative and should not be taken as limiting the scope of the technology. It will be understood by those skilled in the art that the gas distribution system shown is merely one possible distribution system and that other types of showerheads may be employed.

In operation, a substrate 60 may be delivered, such as by a robot, to the load lock chamber 10 and may be placed on a shuttle 65. After the isolation valve 15 is opened, the shuttle 65 may be moved along the track 70. Once the shuttle 65 enters in the processing chamber 20, the isolation valve 15 may close, sealing the processing chamber 20. The shuttle 65 may then be moved through the processing chamber 20 for processing. In one embodiment, the shuttle 65 may be moved in a linear path through the chamber.

As the substrate 60 moves through the processing chamber 20, the first surface 61 of substrate 60 may be repeatedly exposed to the precursor of compound A coming from gas ports 425 and the precursor of compound B coming from gas ports 435, with the purge gas coming from gas ports 445 in between. Injection of the purge gas may be designed to remove unreacted material from the previous precursor prior to exposing the substrate surface 61 to the next precursor. After each exposure to the various gas streams, the gas streams may be evacuated through the vacuum ports 455 by the pumping system 450. Since a vacuum port may be disposed on both sides of each gas port, the gas streams may be evacuated through the vacuum ports 455 on both sides. Thus, the gas streams may flow from the respective gas ports vertically downward toward the first surface 61 of the substrate 60, across the first surface 410 and around the lower portions of the partitions 460, and finally upward toward the vacuum ports 455. In this manner, each gas may be uniformly distributed across the substrate surface 61. Substrate 60 may also be rotated while being exposed to the various gas streams. Rotation of the substrate may be useful in preventing the formation of strips in the formed layers. Rotation of the substrate may be continuous or in discreet steps.

The extent to which the substrate surface 61 is exposed to each gas may be determined by, for example, the flow rates of each gas coming out of the gas port and the rate of movement of the substrate 60. In one embodiment, the flow rates of each gas may be configured so as not to remove adsorbed precursors from the substrate surface 61. The width between each partition, the number of gas ports disposed on the processing chamber 20, and the number of times the substrate may be passed back and forth may also determine the extent to which the substrate surface 61 is exposed to the various gases. Consequently, the quantity and quality of a deposited film may be optimized by varying the above-referenced factors.

In another embodiment, the system 400 may include a precursor injector 420 and a precursor injector 430, without a purge gas injector 440. Consequently, as the substrate 60 moves through the processing chamber 20, the substrate surface 61 may be alternately exposed to the precursor of compound A and the precursor of compound B, without being exposed to purge gas in between.

The embodiment shown in FIG. 4 has the gas distribution plate 30 above the substrate. While the embodiments have been described and shown with respect to this upright orientation, it will be understood that the inverted orientation is also possible. In that situation, the first surface 61 of the substrate 60 may face downward, while the gas flows toward the substrate may be directed upward. In one or more embodiments, at least one radiant heat source 90 may be positioned to heat the second side of the substrate.

In some embodiments, the shuttle 65 may be susceptor 66 for carrying the substrate 60. Generally, the susceptor 66 may be a carrier which helps to form a uniform temperature across the substrate. The susceptor 66 may be movable in both directions left-to-right and right-to-left, relative to the arrangement of FIG. 4, between the load lock chamber 10 and the processing chamber 20. The susceptor 66 may have a top surface 67 for carrying the substrate 60. The susceptor 66 may be a heated susceptor so that the substrate 60 may be heated for processing. As an example, the susceptor 66 may be heated by radiant heat source 90, a heating plate, resistive coils, or other heating devices, disposed underneath the susceptor 66. Although illustrated as a lateral transition, embodiments of system 400 may also be utilized in a rotationally based system in which a wheel may rotate clockwise or counter-clockwise to successively treat one or more substrates positioned under the gas distribution system illustrated. Additional modifications are similarly understood to be encompassed by the present technology.

Figure 5:
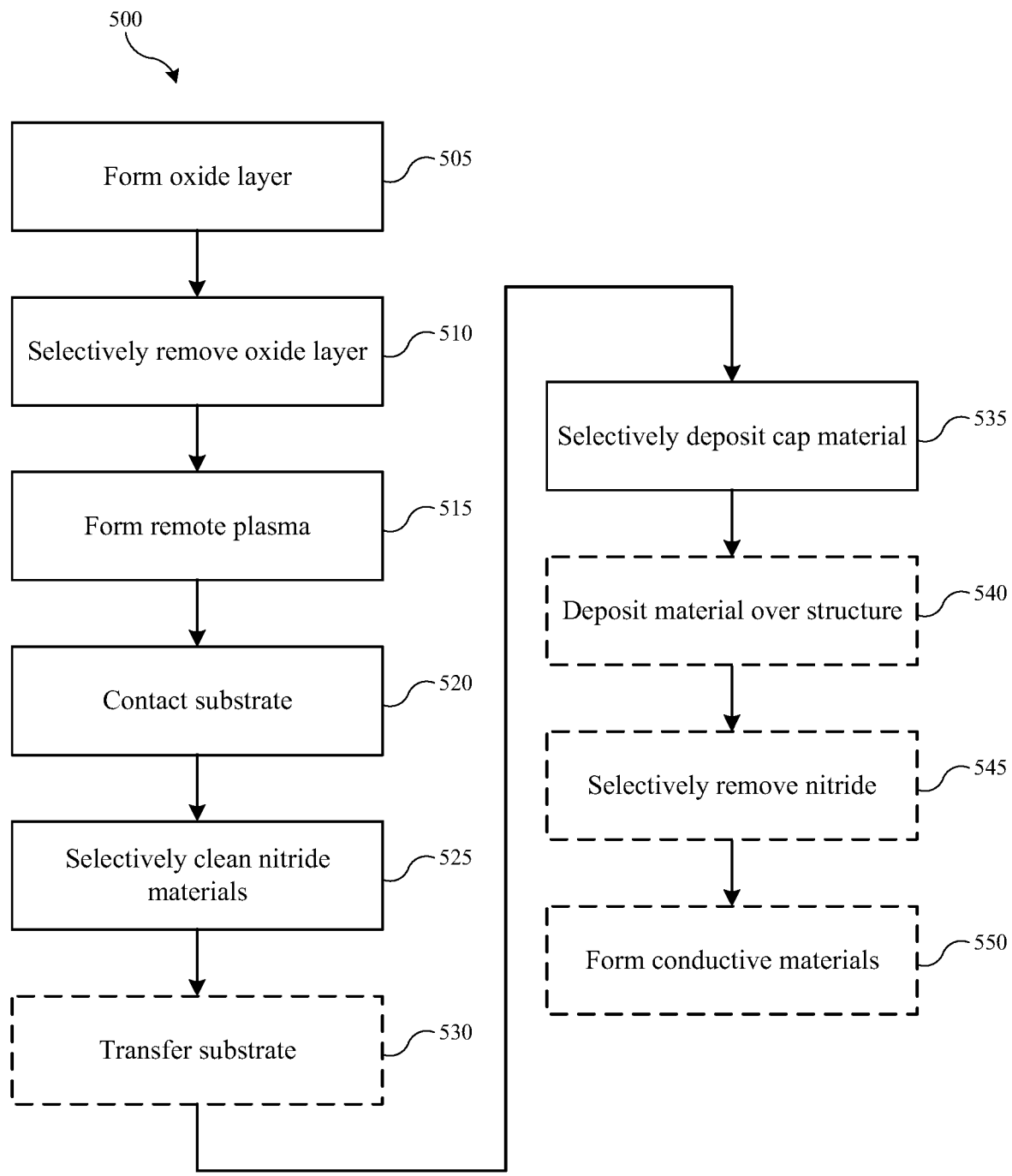
FIG. 5 shows selected operations in a method of forming a semiconductor structure according to embodiments of the present technology.

FIG. 5 illustrates a method 500 of forming a semiconductor structure, many operations of which may be performed, for example, in the chambers 200 and 400 as previously described, as well as in other chambers that may perform the selective operations discussed below. Method 500 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below. Method 500 describes the operations shown schematically in FIGS. 6A-6F, the illustrations of which will be described in conjunction with the operations of method 500. It is to be understood that FIG. 6 illustrates only partial schematic views, and a substrate may contain any number of sections having aspects as illustrated in the figures.

Figure 6A:
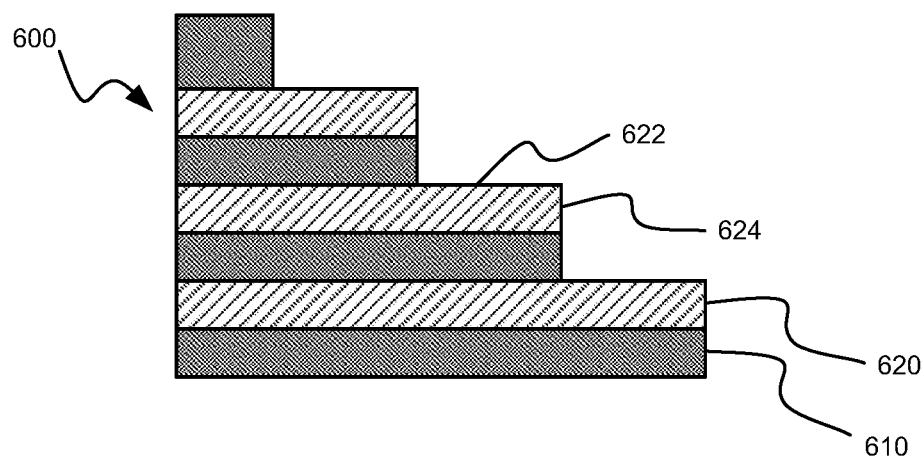
FIGS. 6A-6F show schematic cross-sectional views of exemplary substrates according to embodiments of the present technology.

Method 500 may involve operations performed on a substrate having multiple exposed regions, such as on a substrate including regions to be further developed in producing a 3D NAND structure. As illustrated in FIG. 6A, a portion of a processed structure 600 is shown including a plurality of stacked layers that may be overlying a substrate, which may be silicon, silicon germanium, or other substrate materials. The layers may include layers for producing memory nodes including dielectric material 610, which may be an oxide, such as silicon oxide, in alternating layers with a nitride material 620, which may be silicon nitride, for example. Each layer of the structure may be characterized as including a layer of dielectric material 610 and an overlying layer of nitride material 620. The staircase structure may expose a top portion of the nitride material 620, as well as sidewalls of both the nitride material 620 and the oxide material 610. Although illustrated with only 7 layers of material, exemplary structures may include any number of layers, such as up to or greater than about 10, greater than or about 15, greater than or about 20, greater than or about 25, greater than or about 30, greater than or about 35, greater than or about 40, greater than or about 45, greater than or about 50, greater than or about 55, greater than or about 60, greater than or about 65, greater than or about 70, greater than or about 80, greater than or about 90, greater than or about a hundred, or more layers of materials.

Figure 6B:
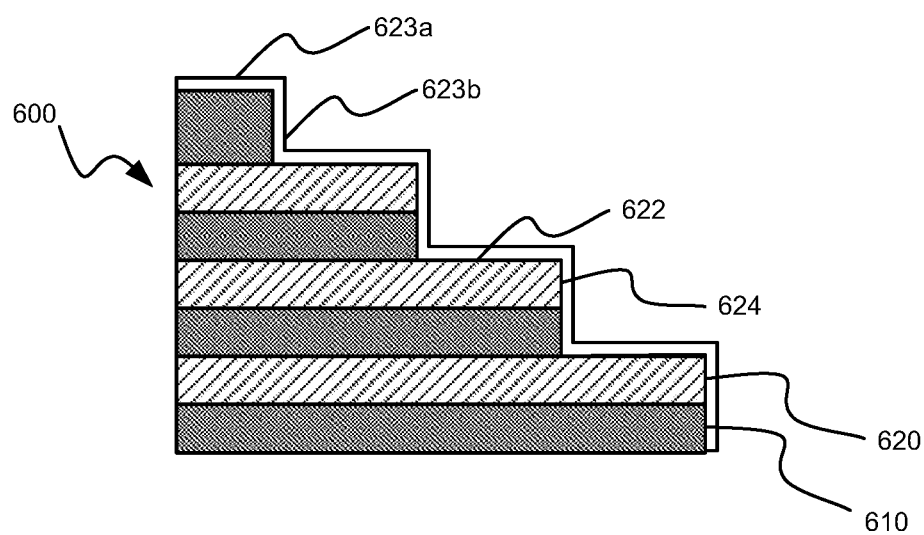
Figure 6C:
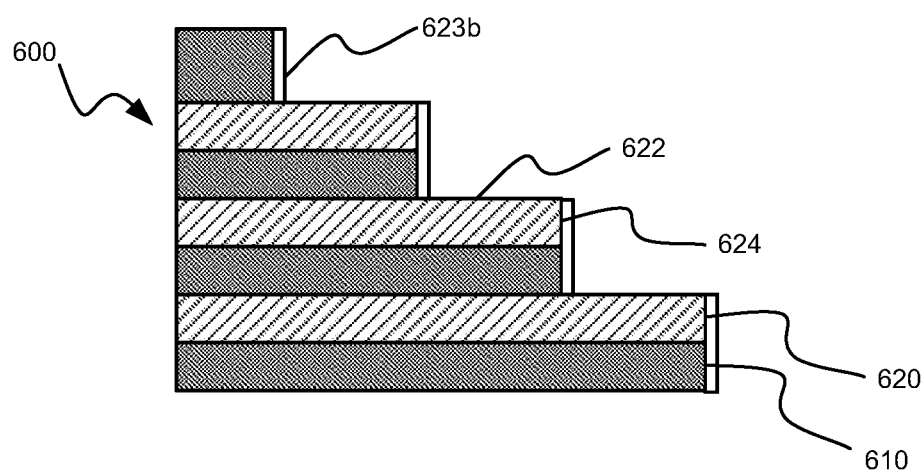

Method 500 may initially include producing a sidewall cap or protective material 623 over the staircase structure as illustrated in FIG. 6B. The protective material 623 may be an oxide layer formed conformally over structure 600 at operation 505. Protective material 623 may include an oxide, nitride, carbon-containing material, or a variety of other materials in embodiments. The material may be formed across a top surface 623*a* as well as sidewall surfaces 623*b* of the structure. The sidewall portions may extend over one or both of oxide material 610 and/or nitride material 620 in embodiments. Once formed, the top surface 623*a* may be recessed to expose a surface of nitride material 620. The top surface 623*a* may be recessed at operation 510 in a variety of ways including by performing a selective removal including a directional component. For example, although top surface 623*a* and sidewall surfaces 623*b* may include similar protective material, the removal may be limited to top surface 623*a*, or may be substantially limited to top surface 623*a*.

In embodiments, a process may be performed to direct an inert plasma towards the protective material 623. For example, a bias plasma, such as a wafer-level DC plasma, may be formed of a precursor such as hydrogen, helium, argon, or some other material that may not chemically react with the protective material 623. By utilizing a DC bias plasma, the plasma effluents may be delivered to the substrate in a substantially normal orientation to the substrate, which may limit or reduce interaction with sidewall surfaces 623*b*. Top surfaces 623*a* may be contacted by the plasma effluents, which may damage protective material 623 in embodiments. Once damaged, the top surfaces 623*a* may be more susceptible to removal than sidewall portions 623*b*. Accordingly, a plasma removal as discussed below may be performed at elevated temperatures, such as above or about 80° C., which may remove top surface 623*a*, while having a limited effect on sidewall portions 623*b*.

Method 500 may include producing a clean surface of the nitride material subsequent formation of the staircase structure on the substrate and removal of top surfaces of the protective material 623. Once positioned within a processing region of the semiconductor processing chamber, the method may include forming a plasma of a fluorine-containing precursor in a remote plasma region of the processing chamber at operation 515. In some embodiments, operation 515 may be a continuation of operation 510, although certain characteristics such as pressure and/or temperature may or may not be adjusted. The remote plasma region may be fluidly coupled with the processing region, although it may be physically partitioned to limit plasma at the substrate level, which may damage exposed structures or materials.

Effluents of the plasma may be flowed into the processing region, where they may contact the semiconductor substrate at operation 520. At operation 525, the nitride material may be selectively cleaned of residual oxide material or other material that may remain on either top surfaces 622 or sidewall surfaces 624 of exposed regions of the nitride material 620. The exposed regions of the nitride material 620 may have been exposed during previous fabrication operations, such as during a staircase formation on the structure, which may be a 3D NAND semiconductor structure. The etch process may have substantially or essentially removed overlying dielectric material 610, although residual particulate material may still remain on the surface. In some embodiments, subsequent operations, such as deposition operations may be at least partially based on the surface of the nitride material 620 being substantially or essentially clear of other materials or particulates, such as of oxide or other materials that may have been in contact with or may have deposited or left residual particulate material on the nitride material 620. Accordingly, the fluorine-containing plasma effluents may be delivered to the exposed regions of nitride to clear residual particulate or other material to provide a top and/or sidewall surface of the nitride materials that is substantially or essentially clear of oxide or other particulate materials. The cleaning process may be similar to an etching process having high selectivity towards oxide relative to nitride. Accordingly, the process may be configured to have minimal impact on the nitride layers being cleaned.

Figure 6D:
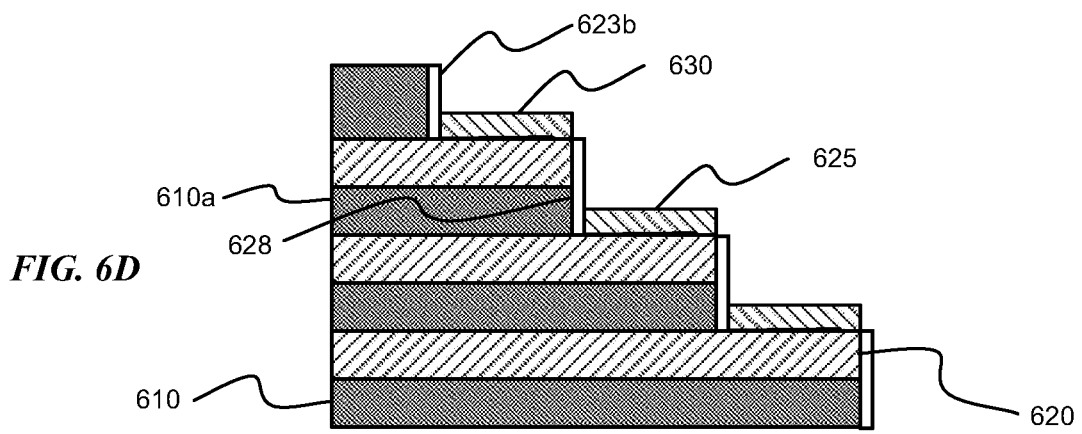

At optional operation 530, the substrate may be transferred from the etching chamber to a deposition chamber. The transfer may occur under vacuum, and the two chambers may both reside on the same cluster tool to allow the transfer to occur in a controlled environment. For example, vacuum conditions may be maintained during the transfer, and the transfer can occur without breaking vacuum. Once in the deposition chamber, such as chamber 400 described above, a cap material may be formed or deposited over the cleaned nitride material 620 at operation 535. As illustrated in FIG. 6D, cap material 625, which may be a dielectric material, may be formed directly on or contacting cleaned nitride material 620. The deposition operation may be a selective deposition in which the cap material is formed preferentially on the nitride material 620 relative to exposed dielectric material 610. As opposed to conventional technologies that may include additional masking operations, operation 535 may be performed directly subsequent etching operation 525.

As shown in the figure, cap material 625 may be formed along top surface 622 or may be formed along both sidewall portion 624 and top surface 622 of nitride materials 620 depending on how much of sidewall portion 624 has been exposed. For example, the selective removal at operation 510 may reduce a height of the protective material 623 exposing a portion of sidewall 624. Cap material 625 may extend along sidewall 624 extending coverage of nitride material 620. Although the formation of cap material 625 may occur preferentially on the nitride material 620 relative to dielectric material 610, the formation of cap material 625 may be conformal or substantially conformal on the top surface 622 and sidewall portion 624. In some embodiments, a difference in thickness between a first portion of cap material 625 along top surface 622 and a second portion of cap material 625 along sidewall surface 624 may be less than or about 5 nm in embodiments, and a difference in thickness may be less than or about 4 nm, less than or about 3 nm, less than or about 2 nm, less than or about 1 nm, less than or about 0.5 nm, less than or about 0.1 nm, or the thickness may be substantially or essentially equal.

Additionally, a thickness of a first portion of cap material 625 along top surface 622 may be less than or about 150% a thickness of a second portion of cap material 625 along sidewall surface 624. In some embodiments the thickness of first portion of cap material 625 may be less than or about 140% the thickness of the second portion, or may be less than or about 130%, less than or about 120%, less than or about 110%, less than or about 109%, less than or about 108%, less than or about 107%, less than or about 106%, less than or about 105%, less than or about 104%, less than or about 103%, less than or about 102%, less than or about 101%, or may be about 100% or an equivalent thickness of the second portion along sidewall portion 624 of nitride material 620.

As illustrated, a separation 628 may be maintained between a first cap material 625 and a second cap material 630 in embodiments. Similar to first cap material 625, second cap material 630 may be characterized by a first portion formed along a top surface of nitride material 620, and a second portion formed along a sidewall surface normal to the top surface of the nitride material. Again, the extent of sidewall coverage may be based on an amount of removal of protective material 630 vertically from a top surface of nitride material 620. The separation 628 may be along an exposed sidewall portion of dielectric material 610 disposed between layers of nitride materials 620. The first cap material 625 and the second cap material 630 may be vertically separated from one another in structure 600 by an exposed portion or sidewall of dielectric material 610a. A length of the separation 628 may be relative to a thickness of the dielectric material, and the separation may be a distance along dielectric material 610a to ensure that first portion of first cap material 625 may not contact second portion of second cap material 630. Because first portion of first cap material 625 may extend vertically parallel to an exposed sidewall of dielectric material 610a, the separation may be less than a thickness of dielectric material 610a in embodiments.

For example, the separation 628 may be less than or about 90% of the thickness of dielectric material 610a, and in embodiments the separation 628 may be less than or about 80% of the thickness of dielectric material 610, less than or about 70% of the thickness, less than or about 60% of the thickness, less than or about 50% of the thickness, less than or about 40% of the thickness, less than or about 30% of the thickness, less than or about 20% of the thickness, less than or about 10% of the thickness, less than or about 5% of the thickness, or less, although due to the characteristics of the formation process, a defined separation 628 may be maintained between the first cap material 625 and the second cap material 630. Some processes for forming semiconductor structures according to the present technology may include replacing the nitride and cap materials with conductive materials on which contacts may be landed. By maintaining a separation between the cap materials 625, 630, contact between the later formed conductive materials may be limited or avoided to reduce shorting between the layers.

Although transfer of the substrate may occur, no other substrate processing may be performed between the selective etching and the selective deposition. As will be explained in further detail below, the selective deposition may include multiple operations, but the entire deposition process may be performed directly after the etching set of operations, although substrate transfer in between the operations may be performed in embodiments. By performing a selective etch and a selective deposition according to the method 500, queue times may be substantially reduced over conventional technology that may require additional masking and removal techniques due to blanket deposition or formation of the cap material 625.

Figure 6E:
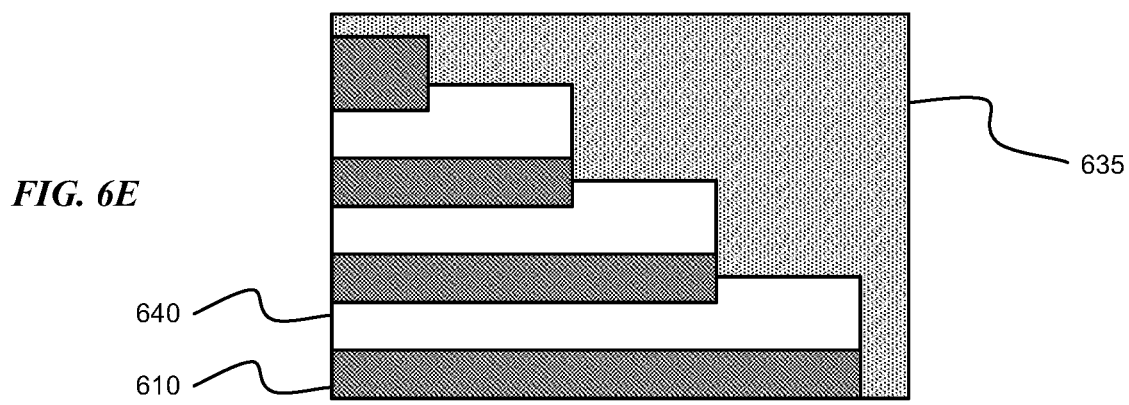

Method 500 may include additional operations subsequent the selective deposition of cap material 625. Although optional to the present technology, additional operations may be performed in a broader fabrication process, such as in forming memory structures. For example, some exemplary operations that may be performed after the cap material is formed include formation or deposition of a dielectric material over the structure 600 at optional operation 540. The deposition may be any number of deposition techniques to provide coverage along the staircase structure. As illustrated in FIG. 6E, material 635 may be formed or deposited over structure 600 to cover the exposed portions of the nitride material 620 and cap material 625 overlying the nitride materials. In some embodiments, the dielectric material 635 may be an oxide material. An additional operation during subsequent fabrication may include removing the nitride materials and cap materials at optional operation 545, which may be placeholders for subsequent conductive materials, such as for contact landing. The nitride materials 620 may be removed laterally from beneath the dielectric material 635 to form gaps 640 within the structure 600.

For example, in some memory structures according to the present technology, the nitride materials 620 and cap materials 625 may be removed with a wet etch operation or a dry etch, such as a plasma-enhanced etch or vapor etch. The removal may be performed selectively relative to dielectric materials 610 and dielectric materials 635 formed on structure 600. The etching may substantially, essentially, or completely remove nitride materials 620 and cap materials 625 to produce gap region 640. Unlike conventional technologies, where such a gap region may be less than a distance across exposed surfaces of dielectric materials 610, the present technology may produce gap regions 640 that may be characterized by a lateral length extending at least to a lateral edge of dielectric material 610. In some embodiments, the gap regions 640 may extend laterally beyond a lateral edge of dielectric material 610 as illustrated.

Conventional technologies may form a conformal layer of cap material as previously discussed, which may need to be etched back to break continuity between the individual layers of the structure. This etch back process, which may be a selective etch, such as selective to nitride relative to oxide materials, may at least slightly over etch the cap material along the sidewalls to ensure a complete division between layers of the structure. Because the laterally underlying material may also be nitride in some structures, the over etch process may reduce a lateral length of the underlying nitride structure, which may then be characterized by a lateral length less than a lateral length of a dielectric material 610 on the same level of the staircase structure. The formation of overlying dielectric material 635 may fill this lateral region. Subsequent gap formation under the additional dielectric may only produce a gap region to the reduced lateral length, which then produces a reduced area or volume for conductive material which may be for a metal contact landing. The present technology not only may maintain a lateral length equivalent to an associated dielectric material of each structural layer, which may be the dielectric material 610 adjacent the gap region or nitride material prior to removal, but may provide a lateral length beyond a lateral length of the associated dielectric material. In this way, additional thickness or volume may be provided for subsequent fill of conductive material.

Figure 6F:
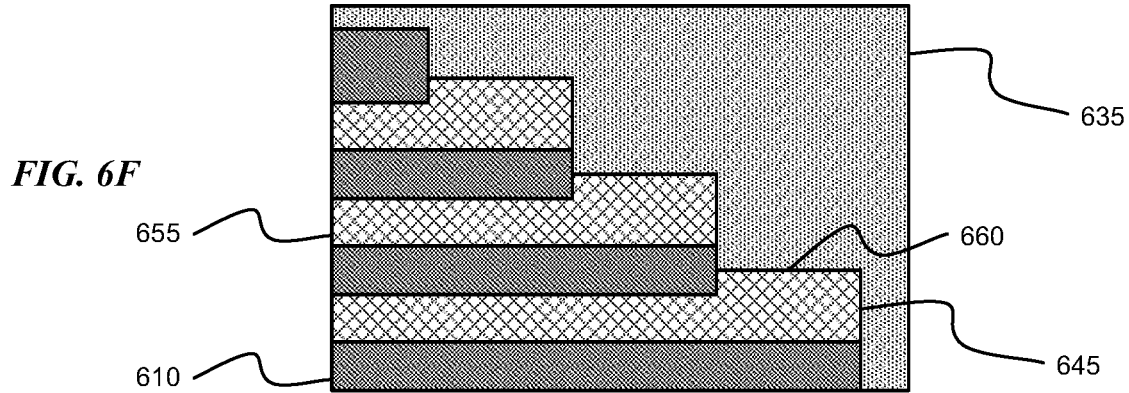

Once gap regions 640 have been formed, conductive material may be delivered or formed within the gap regions 640 at optional operation 550. As illustrated in FIG. 6F, conductive material 645 may be flowed or formed laterally into gap regions 640 beneath dielectric material 635. Based on the formation of cap material 625, which may have been formed to maintain a separation 638 between each layer of the structure, conductive material 645 may be separated from each overlying an underlying region of conductive material, such that the conductive material may not contact conductive material in a different layer of the structure. The conductive material 645 in each layer may extend laterally to within 90% or more of a lateral length of an associated dielectric material 610 of each layer, which may be adjacent or in direct contact with the conductive material 645. In some embodiments, the conductive material 645 may extend laterally to within 95% or 100% of the lateral length of an associated or adjacent dielectric material 610 of each layer.

Additionally, conductive material 645 may extend laterally beyond the lateral length of an associated or adjacent dielectric material 610 of each layer. The conductive material 645 may extend greater than or about 0.1 nm beyond the associated or adjacent dielectric material 610, and may extend greater than or about 0.5 nm, greater than or about 1 nm, greater than or about 2 nm, greater than or about 5 nm, greater than or about 10 nm, or more in embodiments. The length associated with the cap material and eventually formed metal or conductive materials may be based on an original length of dielectric materials 610. For example, because dielectric material 635 may be a similar or the same material as dielectric materials 610, the dielectric coating between conductive regions may be continuous in a final structure. Accordingly, the lengths discussed here may be associated with an original length of materials associated with the formed staircase structure upon formation of the staircase levels.

By providing conductive material 645 that extends at least to or beyond a lateral length of an associated or adjacent dielectric material at each level of the structure, the present technology may provide longer and thicker contact landing materials, which may be superior to conventional materials. Because metal thickness may be inversely proportional to resistance, by providing thicker and longer contact landings materials, the present technology may provide structures characterized by lower resistance.

The metal materials may be formed from one or more materials in embodiments. For example, the gap regions 640 may be characterized by a channel region 655 between layers of dielectric material 610. The metal-containing material may include a barrier layer, which may include a transition metal material, which in some embodiments may be titanium. For example, metal-containing materials used for a barrier layer may include titanium nitride in embodiments. After formation of an optional barrier layer, the channel region 655 may be filled with the conductive material 645. The gap regions 640 may also be characterized by an end portion 660 extending beyond overlying layers of the structure. For example, end portion 660 may be a portion of conductive material beginning from an end of a lateral length of an overlying layer of dielectric material 610 associated with the next upper level of the staircase structure. The conductive material may be contained within end portion 660. Conductive material 645 may be any conductive material that may be utilized in metal contact landings, and may include copper, tungsten, cobalt, or any other metallization material useful in fabrication of semiconductor structures. After the formation of the metal materials, subsequent fabrication may be performed, which may include forming contacts through the structure that may connect with conductive material 645.

The conductive material 645 contained in end portion 660 may also be characterized by a thickness in embodiments. For example, a thickness of conductive material 645 in end portion 660 may be characterized by a thickness greater than or equal to a thickness of material contained in channel region 655. A thickness of conductive material 645 contained in end portion 660 may also be characterized by a thickness greater than or equal to a thickness of an underlying layer of dielectric material 610, such as a thickness of dielectric material 610 associated with the same level of the staircase structure 600 as the conductive material 645. The thickness of conductive material 645 may be at least 105% the thickness of dielectric material 610 on the same level of structure 600 or on a different level of structure 600.

In some embodiments, the thickness of conductive material 645 may be greater than or about 110% the thickness of dielectric material 610 on any level of structure 600, and may be greater than or about 115% of the thickness, greater than or about 120% of the thickness, greater than or about 125% of the thickness, greater than or about 130% of the thickness, greater than or about 135% of the thickness, greater than or about 140% of the thickness, greater than or about 145% of the thickness, greater than or about 150% of the thickness, greater than or about 155% of the thickness, greater than or about 160% of the thickness, greater than or about 165% of the thickness, greater than or about 170% of the thickness, greater than or about 175% of the thickness, greater than or about 180% of the thickness, greater than or about 185% of the thickness, greater than or about 190% of the thickness, greater than or about 195% of the thickness, greater than or about 200% of the thickness, greater than or about 210% of the thickness, greater than or about 220% of the thickness, greater than or about 230% of the thickness, greater than or about 240% of the thickness, greater than or about 250% of the thickness, or any other thickness. However, in embodiments a separation defined by dielectric materials 610 and/or 635 may be maintained between any two amounts of conductive material 645 to maintain separation between the nodes of the structure.

A variety of materials may be utilized in the processing, and the etching and deposition may be selective to multiple components. Accordingly, the present technology may not be limited to a single set of materials. For example, as previously noted, nitride material 620 may be several insulative or sacrificial species utilized in semiconductor processing. Nitride material 620 may be or include nitride, oxide, or any other dielectric materials or sacrificial materials that may be later removed selective to other layers or materials within the memory structure. Dielectric material 610 may also include an insulative material, and may also include a silicon-containing material, an oxygen-containing material, a carbon-containing material, or some combination of these materials, such as silicon oxide or silicon oxycarbide. Cap material 625 may include one or more dielectric materials, insulative materials, ceramic materials, or barrier materials. Although cap material 625 may be any of the dielectric or sacrificial materials noted above, in some embodiments, cap material 625 may be the same material as nitride material 620. For example, cap material 625 may also be silicon nitride in embodiments or may be a material that will etch similarly to nitride materials 620.

The cleaning operations may involve additional precursors along with particular fluorine-containing precursors. Nitrogen trifluoride may be utilized to generate plasma effluents in some embodiments. Additional or alternative fluorine-containing precursors may also be utilized. For example, a fluorine-containing precursor may be flowed into the remote plasma region and the fluorine-containing precursor may include at least one precursor selected from the group consisting of atomic fluorine, diatomic fluorine, bromine trifluoride, chlorine trifluoride, nitrogen trifluoride, hydrogen fluoride, sulfur hexafluoride, and xenon difluoride. The remote plasma region may be within a distinct module from the processing chamber or a compartment within the processing chamber. As illustrated in FIG. 2, both RPS unit 201 and first plasma region 215 may be utilized as the remote plasma region. An RPS may allow dissociation of plasma effluents without damage to other chamber components, while first plasma region 215 may provide a shorter path length to the substrate during which recombination may occur.

An additional precursor may also be delivered to the remote plasma region to augment the fluorine-containing precursor. For example, a nitrogen-containing precursor or a hydrogen-containing precursor may be delivered with the fluorine-containing precursor. In some embodiments the precursor may include nitrogen and hydrogen, such as ammonia, for example. The additional precursor may also be a fluorine-containing precursor, such as methyl fluoride, for example. The nitrogen-containing or hydrogen-containing precursor may be included to maintain a particular H:F atomic ratio for the plasma effluents.

The selective deposition may be performed in a chamber capable of deposition, and which may be capable of atomic layer deposition, including chamber 400 as described above. The deposition may be premised on selectively depositing an insulative material on a nitride material relative to another insulative material. For example, the cap material 625 may be formed substantially on nitride material 620, while being minimally formed or limited from dielectric material 610. The selective deposition may be performed by multiple operations, which may include formation of a self-assembled monolayer to facilitate selective deposition, or may include actively inhibiting formation of dielectric on other dielectric materials.

Self-assembled monolayers may be formed on regions of the structure to tune deposition. For example, a first self-assembled monolayer may be formed over the structure, and then exposed to remove the monolayer from nitride material 620. The monolayer may be maintained over dielectric material 610. The monolayer may have termination moieties that may repel or fail to interact with later delivered precursors. For example, the termination moieties may be hydrophobic in embodiments, and may terminate with hydrogen-containing moieties, such as methyl groups, which may not interact with additional precursors. A second self-assembled monolayer may be formed over the nitride material 620, which may be hydrophilic or reactive with one or more precursors utilized to produce cap material 625. The second self-assembled monolayer may be formed selectively over the nitride material 620, as the material may be repelled from the first self-assembled monolayer, or may be drawn selectively to the metal. The second self-assembled monolayer may terminate with hydroxyl or other hydrophilic moieties, or with moieties that interact specifically with additional precursors used to form cap material 625.

An atomic layer deposition may then be performed utilizing two or more precursors to develop cap material 625. The precursors of the deposition may include a metal-containing precursor and a precursor configured to interact with the moieties terminating the second self-assembled monolayer, but not the first self-assembled monolayer. For example, when hydrophilic and hydrophobic terminating monolayers are utilized, one of the atomic layer deposition precursors may include water, or some other precursor to develop the cap material that may be hydrophilic. In this way, the deposition may not form over the first self-assembled monolayer, which may be hydrophobic. If the cap material includes an oxide, such as silicon oxide, the precursors used in the atomic layer deposition may include a silicon-containing precursor, as well as water. The water may then fail to interact with the first self-assembled monolayer formed over the dielectric material 610 during the half reaction with water or the other precursor, and thus the deposition will not form over the first self-assembled monolayer. In this way, the cap material 625 may be selectively formed over the nitride material 620 without a mask layer being formed that may be chemically etched.

After cap material 625 has been formed to a suitable height, the first self-assembled monolayer may be exposed, such as to UV light in one example, and removed from the substrate. Accordingly, the first self-assembled monolayer may be formed directly subsequent the selective etch of the metal material, or after transfer to an additional chamber but before additional process operations, and an additional masking layer that requires chemical removal or etching may not be utilized on the structure. Similarly an etch of cap material 625 may not be necessary subsequent the selective deposition to ensure the cap material 625 is formed selectively over the metal material. In this way, multiple operations utilized in conventional formation may be obviated, which may reduce queue times significantly, such as by hours.

Additional selective deposition techniques may also be utilized that may include alternative mechanisms for selectively depositing a dielectric material such as a nitrogen-containing material. For example, a nitrogen-containing material may be utilized as one of the self-assembled monolayers on a material for which deposition is to occur, such as in one of the termination moieties of the monolayers, which may allow attraction of particular precursors used in the formation of one or more of the materials previously described. For examples, nitrogen-containing termination moieties may be utilized, and one or more amines may be utilized during the specific layer formation. Still other techniques may utilize temperature differentials to enhance deposition on nitride relative to silicon oxide. For example, an atomic layer deposition utilizing a silicon-containing precursor and a nitrogen-containing precursor may be performed at temperatures above or about 500° C., and may be performed at temperatures above or about 750° C., above or about 900° C., above or about 1000° C., or up to, above, or about 1100° C.

As temperature is increased within this range, the deposition may occur on nitride at a higher rate than on silicon oxide. A selective etch of nitrogen may then be performed to remove the first dielectric material from the silicon oxide surface. Although the first dielectric material may also be reduced on the nitride material surface, because the thickness may be many times greater than that on the silicon oxide, full removal from the silicon oxide may be performed while maintaining a thickness on the nitride material.

Embodiments may also utilize an inhibitor to form cap material 625 selectively over nitride material 620, while not forming cap material 625 over dielectric material 610. For example, an inhibitor may be applied across the dielectric material. The inhibitor may be any number of materials that may be characterized by a siloxane backbone, such as silicone, or a tetrafluoroethylene backbone, such as PTFE, along with other oil or surfactant materials. The material may be applied to cover exposed portions of dielectric material 610. The inhibitor material may prevent adhesion or adsorption of the material, which may form or deposit normally on nitride material 620. Subsequent formation of cap material 625, a removal agent may be applied to the substrate to remove the inhibitor material. The removal agent may be a wet etchant, reactant, or surfactant cleanser that may remove residual inhibitor material exposing the underlying dielectric material 610. Accordingly, the inhibitor may be applied directly subsequent the selective etch, or subsequent transfer of the substrate, but prior to other process operations affecting the substrate. Utilizing an inhibitor may allow formation of the cap material in a defined region that need not be defined via subsequent patterning and/or etching of a blanket film. By removing prior and subsequent patterning operations, the processes may further reduce queue times over conventional processes.

The inhibitor may also be a poisoning agent or a product of a plasma application that may neutralize or render inert a surface of the substrate. For example, a modifying plasma may be formed from one or more precursors, which may include inert precursors. The plasma may be applied to a surface of the substrate, which may alter surfaces of dielectric material 610, but which may not affect the nitride material 620. In one possible example, a nitrogen-containing precursor, which may be nitrogen, may be delivered to a plasma processing region of a processing chamber, where a plasma is generated. The plasma effluents, which may include nitrogen-containing plasma effluents, may be delivered to a substrate, and may form a nitrogenized surface along dielectric material 610.

The plasma effluents may not affect the nitride material 620, which may maintain a neat or unreacted surface. Cap material 625 may then be formed with one or more deposition techniques, which may include atomic layer deposition or other vapor or physical deposition. For example, an atomic layer deposition technique may be utilized subsequent processing with the plasma effluents. After each cycle of the deposition, a nitrogen-containing plasma may be reapplied to the substrate, such as over dielectric material 610. In this way, the surface of dielectric material 610 may be passivated to prevent or limit formation of cap material 625 over those regions. Other plasma or non-plasma materials may also be used to modify or poison dielectric material 610, which may also be treated to repel one or more of the precursors which may be used in the formation of cap material 625. Utilizing these plasma effluents on non-recessed portions of the substrate may allow formation of the cap material in a defined region that need not be defined via subsequent patterning and/or etching of a blanket film. By removing prior and subsequent patterning operations, the processes may further reduce queue times over conventional processes.

Any of these techniques may selectively deposit or form dielectric or insulative materials over a nitrogen-containing region relative to one or more non-metal, dielectric, or insulative regions. The selectivity may be complete in that the cap material forms only over nitride material 620, or an intervening layer, and cap material may not form at all over dielectric material 610. In other embodiments the selectivity may not be complete, and may be in a ratio of deposition on nitrogen-containing materials relative to dielectric or insulative materials greater than about 2:1. The selectivity may also be greater than or about 5:1, greater than or about 10:1, greater than or about 15:1, greater than or about 20:1, greater than or about 25:1, greater than or about 30:1, greater than or about 35:1, greater than or about 40:1, greater than or about 45:1, greater than or about 50:1, greater than or about 75:1, greater than or about 100:1, greater than or about 200:1, or more.

The cap material may be formed to a thickness described previously, which may be less than or about 50 nm, and may be less than or about 40 nm, less than or about 30 nm, less than or about 20 nm, less than or about 10 nm, less than or about 5 nm, or less. Accordingly, selectivities below 50:1 may be acceptable to fully deposit cap material 625 while forming a limited amount or essentially not forming material over the dielectric material 610. A slight etch back operation may be performed in chamber 200 subsequent the deposition to ensure cap material 625 is fully removed from dielectric material 610, to ensure that the sections are separated completely. Because the coverage may be complete across the exposed surfaces of nitride material 620, the etch back may not affect the material deposited, or may clean the edges or sidewalls to produce a smooth surface. As the deposition may be greater on the nitride material 620, any amount that may deposit on dielectric material 610, may be compensated on nitride material 620 by a slightly longer deposition time, which may then be recessed to the thickness of the desired amount, and which may clean the sidewalls of the dielectric material 610.

The deposition operations may be performed at any of the temperature or pressures previously described, and may be performed at temperatures greater than or about 50° C., and may be performed greater than or about 100° C., greater than or about 150° C., greater than or about 200° C., greater than or about 250° C., greater than or about 300° C., greater than or about 350° C., greater than or about 400° C., greater than or about 450° C., greater than or about 500° C., greater than or about 600° C., greater than or about 700° C., greater than or about 800° C., or higher. For example, temperatures greater than or about 400° C. may be utilized during atomic layer deposition operations in order to activate precursors to interact with one another as layers of material are being formed. By utilizing the present technology, fabrication may be performed with more selective formation and removal over conventional techniques, which may reduce queue times by hours over conventional processes. By performing the recessing operations in addition to the cap formation, the present technology may provide thicker and/or longer metal contact landing regions on memory or other structures. This may reduce resistance in memory or other structures according to the present technology.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming a semiconductor structure, the method comprising:
   forming a layer of material across a substrate, wherein the substrate comprises alternating layers of nitride materials and dielectric materials in a stepped structure, and wherein the layer is formed along horizontal surfaces and vertical surfaces of the stepped structure;
   forming a plasma of a fluorine-containing precursor in a remote plasma region of a processing chamber;
   contacting a semiconductor substrate with effluents of the plasma, wherein the semiconductor substrate is housed in a processing region of the processing chamber;
   selectively cleaning the nitride material with the effluents of the plasma, wherein the cleaning removes residual portions of the layer of material from the horizontal surfaces of the stepped structure while substantially maintaining the layer of material on the vertical surfaces of the stepped structure; and
   subsequently depositing a cap material over the cleaned nitride material on the horizontal surfaces of the stepped structure, wherein the cap material is selectively deposited on the nitride material relative to exposed regions of the layer of material on the vertical surfaces of the stepped structure.

2. The method of forming a semiconductor structure of claim 1, wherein the cleaning is performed in a first processing chamber, and the depositing is performed in a second processing chamber.

3. The method of forming a semiconductor structure of claim 2, further comprising transferring the semiconductor substrate from the first processing chamber to the second processing chamber, wherein the transferring is performed without breaking vacuum.

4. The method of forming a semiconductor structure of claim 1, further comprising selectively etching the nitride materials and the cap material to form a gap.

5. The method of forming a semiconductor structure of claim 4, wherein the etching comprises a wet etch or a plasma-enhanced etch.

6. The method of forming a semiconductor structure of claim 4, further comprising forming a metal material within the gap, wherein the metal material comprises titanium nitride or tungsten.

7. The method of forming a semiconductor structure of claim 1, wherein the cap material comprises silicon nitride.

8. The method of forming a semiconductor structure of claim 1, wherein the layer of material comprises silicon oxide.

9. The method of forming a semiconductor structure of claim 1, wherein the deposition is performed with a selectivity towards the nitride materials relative to the dielectric material greater than or about 2:1.

10. The method of forming a semiconductor structure of claim 1, wherein selectively depositing the cap material comprises inhibiting growth of the cap material on the dielectric material.

11. The method of forming a semiconductor structure of claim 1, wherein the cap material is formed to maintain separation between separate cap material formations.

12. A method of forming a semiconductor structure, the method comprising:
   forming a layer of material conformally along horizontal surfaces and vertical surfaces of a stepped structure;
   forming a plasma of a fluorine-containing precursor in a remote plasma region of a processing chamber;
   contacting a semiconductor substrate with effluents of the plasma, wherein the semiconductor substrate is housed in a processing region of the processing chamber;
   selectively cleaning regions of a nitride material positioned proximate exposed regions of the layer of material on the semiconductor substrate, wherein the cleaning removes residual portions of the layer of material from horizontal surfaces of the stepped structure while substantially maintaining the layer of material on vertical surfaces of the stepped structure; and
   subsequently forming a cap material over the nitride material on the horizontal surfaces of the stepped structure, wherein the cap material is selectively formed on the nitride material relative to exposed regions of the layer of material on the vertical surfaces of the stepped structure.

13. The method of forming a semiconductor structure of claim 12, wherein, subsequent the cleaning, the substrate comprises a first exposed region of the nitride material and a second exposed region of the nitride material vertically separated by an exposed region of the layer of material, wherein the layer of material comprises silicon oxide, and wherein the cap material comprises silicon nitride.

14. The method of forming a semiconductor structure of claim 13, wherein each exposed region of the nitride material comprises an exposed top surface and an exposed sidewall normal to the top surface, wherein the cap material is formed on the exposed top surface and the exposed sidewall of the first nitride material and the second nitride material, and wherein the cap material formed on the first nitride material does not contact the cap material formed on the second nitride material subsequent the formation.

15. The method of forming a semiconductor structure of claim 12, further comprising removing the first nitride material, the second nitride material, and the cap materials from the semiconductor substrate.

16. The method of forming a semiconductor structure of claim 1, further comprising, subsequent forming the layer of material:
    forming a plasma of a gas that is not chemically reactive with the layer of material; and
    contacting the layer of material with plasma effluents of the gas.

17. The method of forming a semiconductor structure of claim 16, wherein contacting the layer of material comprises:
    delivering the plasma effluents in a direction substantially normal to the substrate, wherein the delivering damages the layer of material along the horizontal surfaces while substantially maintaining the vertical surfaces.

18. The method of forming a semiconductor structure of claim 17, wherein selectively cleaning the nitride materials comprises removing a damaged portion of the layer of material along the horizontal surfaces.

* * * * *